United States Patent [19]
Stodieck

[11] Patent Number: 5,448,714
[45] Date of Patent: Sep. 5, 1995

[54] SEQUENTIAL-ACCESS AND RANDOM-ACCESS DUAL-PORT MEMORY BUFFER

[75] Inventor: Robert W. Stodieck, Santa Clara, Calif.

[73] Assignee: Integrated Device Technology, Inc., Santa Clara, Calif.

[21] Appl. No.: 293,116

[22] Filed: Aug. 19, 1994

Related U.S. Application Data

[63] Continuation of Ser. No. 816,880, Jan. 2, 1992, abandoned.

[51] Int. Cl.$^6$ .................. G06F 13/28; G06F 13/14
[52] U.S. Cl. ........................... 395/476; 395/401; 395/421.03; 395/421.08; 395/421.09; 395/846; 365/189.05; 365/230.05; 365/230.09; 364/DIG. 1; 364/242.3; 364/244.8; 364/251; 364/259.2
[58] Field of Search ............. 395/425, 275, 400; 365/189.05, 230.05, 230.09

[56] References Cited
U.S. PATENT DOCUMENTS

| | | | |
|---|---|---|---|
| 4,698,753 | 10/1987 | Hubbins et al. | 395/325 |
| 4,750,149 | 6/1988 | Miller | 395/250 |
| 4,780,822 | 10/1988 | Miller | 395/425 |
| 4,937,781 | 6/1990 | Lee et al. | 395/425 |
| 4,949,301 | 8/1990 | Joshi et al. | 395/425 |
| 5,157,776 | 10/1992 | Foster | 395/425 |
| 5,218,686 | 6/1993 | Thayer | 395/425 |
| 5,268,865 | 12/1993 | Takasugi | 365/189.05 |

OTHER PUBLICATIONS

J. C. Smith, "Functional Description of the IDT70825 SARAM 8K X 16 Dual-Port RAM", Application Note An-120, Integrated Device Technology, © 1993.

Primary Examiner—Glenn Gossage
Assistant Examiner—Reginald G. Bragdon
Attorney, Agent, or Firm—Thomas E. Schatzel

[57] ABSTRACT

For interfacing a random-access (microprocessor-type) device to a sequential-access type device, such as EISA (Extended Industry Standard Architecture)-bus-memory (RAM) cell array (110), employed is a dual-port random-access-memory (RAM) cell array (110), for storing/retrieving words of data and a set of command and status registers (COMMAND/STATUS REGS) (160). Also employed is a combination of a set of end-address registers (END ADD #1-2) (162), a set of comparators (COMPARATOR) (164), and a set of next-address registers (NEXT ADD #1-2) (166), the combination permitting the sequential-access and random-access dual-port memory buffer (100) to jump from one dual-port random-access-memory (RAM) cell-array (110) sequential address, stored in an end address register (END ADD #1-2) (162) to another dual-port random-access-memory (RAM) cell-array (110) sequential address, stored in a next address register (NEXT ADD #1-2) (166). Further utilized is a combination of an incrementor (180) and a pointer register (182), the incrementor and pointer register combination providing the dual-port random-access-memory (RAM) cell array (110) a sequential address; a pointer-logic unit (200); and a semaphore circuit (202).

3 Claims, 1 Drawing Sheet

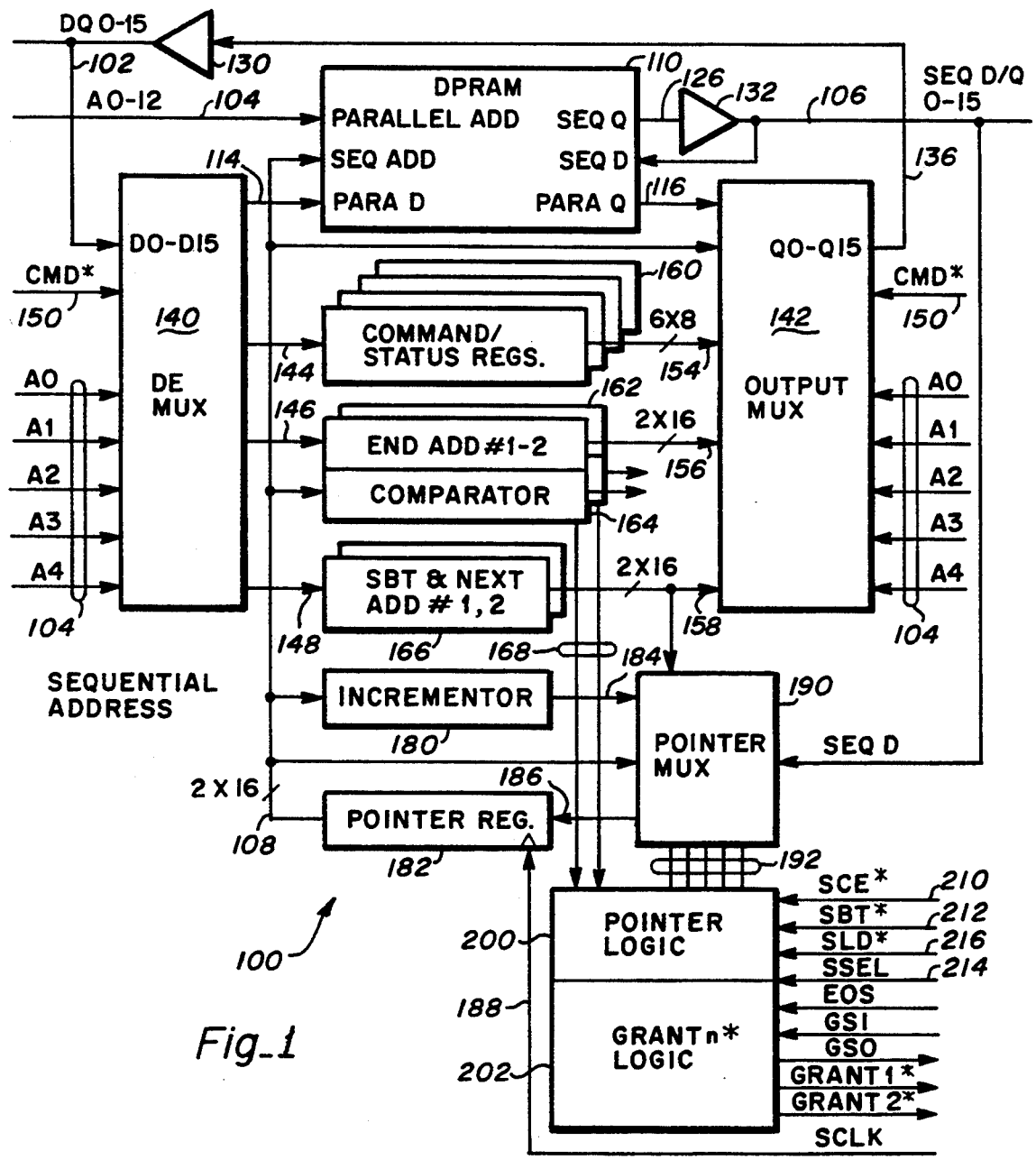
Fig_1

SEQUENTIAL-ACCESS AND RANDOM-ACCESS DUAL-PORT MEMORY BUFFER

This is a continuation of application(s) Ser. No. 07/816,880 filed on Jan. 2, 1992, now abandoned.

BACKGROUND OF THE INVENTION

1. Field of the Invention

The present invention relates to integrated circuit-type devices generally and more particularly to a sequential-access and random-access dual-port memory buffer.

2. Description of the Related Art

A FIFO (first-in-first-out) buffer functions as a shift register having an additional control section that permits input data to "fall through" to the first vacant stage. In other words, if there is data stored in the FIFO buffer, it is available at the output even though all of the states are not filled. Thus, in effect, a FIFO buffer functions as a "variable-length" shift register, the length of which is always the same as the data stored therein.

Although shift registers may be used, of late, many FIFO buffers are implemented with dual-port random-access memories (RAMs) and counters. For additional information regarding FIFO buffers, the reader is referred to the U.S. Pat. No. 4,750,149.

As such, FIFO buffers are particularly suited for use in applications in which there is a need to compensate for differences in the rate of flow of data. For example, FIFO buffers are particularly suited for use in storing data which is to be written onto a disk and/or which has been read off of a disk; for use in storing data which is to be transmitted to a local area network (LAN) and/or which has been received from a LAN; and for use in storing data which is to be printed.

Computers of the type which are designated IBM Personal Computer (IBM PC) and PC/XT by International Business Machines (IBM) Corporation include an interface bus for receiving, external, plug-in cards. This (PC/XT) bus is relatively limited, permitting the transfer of only eight-data bits at one time. In computers of the type which are designated PC/AT by International Business Machines (IBM) Corporation the (PC/XT) bus is extended, permitting the simultaneous transfer of sixteen-data bits. This (PC/XT/AT) bus is further extended in computers of the type which are commonly designated EISA.

Proper connection to the EISA bus requires a number of specific signals each having specific timing. These signals are provided by EISA bus interface devices of the type which are designated 82355 by the Intel Corporation. Unfortunately, the above mentioned EISA bus interface devices are intended for connection between the EISA bus and a sequential-access (buffer) device, which provides specific signals each having specific timing.

Thus, a need exists for a buffer suitable for connection between a random-access (microprocessor-type) device and a sequential-access device. Preferably, to the random-access device, the buffer should appear as a random-access-memory RAM cell array. To the sequential-access device, the buffer should appear as a sequential-access buffer. Preferably, the buffer should, additionally, provide the signals necessary for connection to the above-mention EISA-bus-interface-type devices.

SUMMARY OF THE INVENTION

It is therefore the primary object of the present invention to provide a buffer suitable for connection between a random-access (microprocessor) type device and a sequential-access-type device.

Another object of the present invention is to provide a sequential-access and random-access dual-port memory buffer suitable for connection to an EISA-bus-type-interface device.

Briefly, the presently preferred embodiment of a sequential-access and random-access dual-port memory buffer (100) in accordance with the present invention employs a dual-port random-access-memory (RAM) cell array (110), for storing/retrieving words of data; a set of command and status registers (COMMAND/-STATUS REGS) (160); a combination of a set of end-address registers (END ADD #1-2) (162), a set of comparators (COMPARATOR) (164), and a set of next-address registers (NEXT ADD #1-2) (166), the combination permitting the sequential-access and random-access dual-port memory buffer (100) to jump from one dual-port random-access-memory (RAM) cell-array (110) sequential address, stored in one of the end-address registers (END ADD #1-2) (162), to another dual-port random-access-memory (RAM) cell-array (110) sequential address, stored in one of the next-address registers (NEXT ADD #1-2) (166); a combination of an incrementor (180) and a pointer register (182), the combination for providing dual-port random-access-memory (RAM) cell array (110) a sequential address; a pointer-logic unit (200); and a semaphore circuit for random/sequential access dual-port RAM-cell array unit (202).

These and other objects of the present invention will no doubt become apparent to those skilled in the art after having read the detailed description of the presently preferred embodiment of the present invention which is illustrated in the figure of the drawing.

BRIEF DESCRIPTION OF THE FIGURE IN THE DRAWING

FIG. 1 is a combined schematic and block diagram of an embodiment in accordance with the present invention of a sequential-access and random-access dual-port memory buffer.

DESCRIPTION OF THE PREFERRED EMBODIMENT

Illustrated in FIG. 1 of the drawing generally designated by the number 100 is the presently preferred embodiment of a sequential-access and random-access dual-port memory buffer in accordance with the present invention. Buffer 100 is connected to three external busses, which are respectively designated 102, 104, and 106. Bus 102 is a sixteen-line, bidirectional, parallel-access data input/output bus, upon which buffer 100 both receives a set (of sixteen) externally-generated signals (DQ 0-15), that represent words of data, and develops a set (of sixteen) data-word signals (DQ 0-15). Bus 104 is a thirteen-line parallel-access address bus, upon which buffer 100 receives a set of thirteen, externally-generated, address signals (A 0-12). Finally, bus 106 is a sixteen-line, bidirectional, serial-access data input/output bus, upon which buffer 100 both receives a set (of sixteen) externally-generated data-word signals (SEQ DQ 0-15) and develops a set (of sixteen) data-word signals (SEQ DQ 0-15). Also, for sequential-access, buffer 100 is connected to an internal-only sixteen-line sequential-access address bus 108.

Buffer 100 employs a dual-port random-access-memory (RAM) cell array, which is designated 110. In the presently preferred embodiment, array 110 is arranged as 8K by sixteen cells. Array 110 is configured, on the random (parallel) access side, with a (first) set of thirteen, array-address inputs (PARALLEL ADD) each connected to the respective line of the thirteen lines of parallel-access address bus 104, to receive the set of thirteen, externally-generated, address signals (A 0–12); with a set of sixteen, array-data inputs (PARA D) each connected to a respective line of a sixteen-line bus 114; and with a set of sixteen, array-data outputs (PARA Q) each connected to a respective line of a sixteen-line bus 116. On the sequential-access side, array 110 is configured with another (second) set of thirteen, array-address inputs (SEQ ADD) each connected to a respective line of the thirteen lowest-order lines of the sixteen lines of internal sequential-access address bus 108, to receive another set of thirteen address signals; with another (second) set of sixteen, array-data inputs (SEQ D) each connected to the respective line of the sixteen lines of, bidirectional, serial-access data input/output bus 106, to receive the set of sixteen, externally-generated, data signals (DQ 0–15); and with another (second) set of sixteen, array-data outputs (SEQ Q) each connected to a respective line of a sixteen-line bus 126.

On a parallel-access write cycle, dual-port random-access-memory (RAM) cell array 110 is operative to store the (sixteen-bit) word of data represented by the signals developed on the sixteen lines of bus 114 at the set of sixteen cells designated by the signals (A 0–12) externally developed on the thirteen lines of address bus 104. Further, on a parallel-access read cycle, array 110 is operative to retrieve the (sixteen-bit) word of data stored at the set of sixteen cells designated by the signals (A 0–12) externally developed on the thirteen lines of address bus 104 and to develop on the sixteen lines of bus 116 signals representing the (sixteen-bit) retrieved data word. Similarly, on a sequential-access write cycle, array 110 is operative to store the (sixteen-bit) word of data represented by the signals (DQ 0–15) externally developed on the sixteen lines of, bidirectional, serial-access data input/output bus 106 at the set of sixteen cells designated by the signals developed on the thirteen lowest-order lines of the sixteen lines of bus 108. Further, on a sequential-access read cycle, array 110 is operative to retrieve the (sixteen-bit) word of data stored at the set of sixteen cells designated by the signals externally developed on the thirteen lowest-order lines of the sixteen lines of bus 106 and to develop on the sixteen lines of bus 126 signals representing the (sixteen-bit) retrieved data word.

Buffer 100, additionally, employs two sets of sixteen, tri-state, buffers, including a parallel-access tri-state-buffer set 130 and a serial-access tri-state-buffer set 132. Tri-state-buffer set 130 is configured to selectively develop (on a parallel-access read cycle) a set of (sixteen) signals (DQ 0–15) on the sixteen lines of, bidirectional, parallel-access data input/output bus 102, so as to selectively couple (sixteen-bit) words of data from a sixteen-line bus 136 to bus 114. For this purpose, each of the tri-state buffers of set 130 is configured with the buffer input connected to a respective line of the sixteen lines of bus 136 and with the buffer (tri-state) output connected to the respective line of the sixteen lines of bus 102. To selectively develop (on a sequential-access read cycle) a set of (sixteen) signals (DQ 0–15) on the sixteen lines of, bidirectional, serial-access data input/output bus 106, so as to selectively couple (sixteen-bit) words of data from bus 126 to bus 106, the tri-state buffers of set 132 are configured each with the buffer input connected to a respective line of the sixteen lines of bus 126 and with the buffer (tri-state) output connected to the respective line of the sixteen lines of bus 106.

For parallel access, buffer 100, further, employs, in one embodiment two sets of sixteen multiplexers, including an input multiplexer (means) set (INPUT MUX) 140 and an output multiplexer (means) set (OUTPUT MUX) 142. Input multiplexer set (INPUT MUX) 140, which includes sixteen, one-line-to-eleven-line multiplexers, is configured to develop a set of (sixteen) signals on a selected one of eleven busses so as to selectively couple (sixteen-bit) words of data from the sixteen lines of, bidirectional, parallel-access data input/output bus 102 to the selected bus. For this purpose, each of the multiplexers of set 140 is configured with the multiplexer data input connected to a respective line of the sixteen lines of bus 102. Further, each of the multiplexers of set 140 is configured with one of the multiplexer data outputs connected to the respective line of the sixteen lines of bus 114. In addition, eight of the multiplexers of set 140 are configured, each with six (other) multiplexer data outputs connected to the respective lines of a six-by-eight line bus 144. Also, each of the multiplexers of set 140 is configured with two (other) multiplexer data outputs connected to the respective lines of a two-by-sixteen line bus 146 and with the two (remaining) (other) multiplexer data outputs connected to the respective lines of another two-by-sixteen line bus 148. Finally, the multiplexers of set 140 are configured each with the multiplexer enable input connected to a line 150, to receive an externally-generated, (active-low) command (/CMD) signal and with the five multiplexer select inputs connected to the five lowest order lines of the thirteen lines of parallel-access address bus 104, to receive the five lowest order address signal (A0, A1, A2, A3, and A4), externally generated thereon. In another embodiment, the busses (102, 114, 144, 146, and 148) are interconnected; and, only an enabling signal is multiplexed (by the multiplexing means).

Output multiplexer set (OUTPUT MUX) 142, which, in one embodiment, includes sixteen, twelve-line-to-one-line, multiplexers, is configured to develop a set of (sixteen) signals on bus 136 so as to couple (sixteen-bit) words of data from a selected one of twelve busses to bus 136. For this purpose, each of the multiplexers of set 142 is configured with one of the multiplexer data inputs connected to the respective line of the sixteen lines of bus 116 and with another one of the multiplexer data inputs connected to the respective line of the sixteen lines of internal sequential-access address bus 108. Further, eight of the multiplexers of set 142 are configured, each with six (other) multiplexer data inputs connected to the respective lines of a six-by-eight line bus 154. In addition, each of the multiplexers of set 142 is configured with two (other) multiplexer data inputs connected to the respective line of a two-by-sixteen line bus 156; with the two (remaining) (other) multiplexer data inputs connected to the respective line of another two-by-sixteen line bus 158; and with the multiplexer data output connected to a respective line of the sixteen lines of, bidirectional, parallel-access data input/output bus 102. Finally, the multiplexers of set 142 are configured each with the multiplexer enable input connected to line 150, to receive the externally-generated, (active-low) command (/CMD) signal and with the five multiplexer select inputs connected to the five lowest order lines of the thirteen lines of parallel-access address bus 104, to receive the five lowest order address signal (A0, A1, A2, A3, and A4), externally generated thereon. In another embodiment, output multiplexer means 142 includes sets of tri-state buffers.

Buffer 100, also, employs a set of (preferably six) eight-bit command and status registers (COMMAND/STATUS REGS), which are collectively designated 160. Command and status register set 160 is configured to store in the command register addressed responsive to the state of the addressing signals externally generated on the five lowest order lines of the thirteen lines of parallel-access address bus 104 (A0, A1, A2, A3, and A4) the (eight-bit) word of data represented by the signals externally generated on (preferably) the eight lowest order lines of the sixteen lines of, bidirectional, parallel-access data input/output bus 102, when an active (low) level (/CMD) signal is externally generated on command line 150. In addition, command and status register set 160 is configured to develop on the lines of bus 154 signals representing the (eight-bit) words of data stored in the command and status registers. For this purpose, the eight inputs of each of the command registers of command and status register set 160 are connected to a respective one of the six-by-eight lines of bus 144. In addition, for this purpose, the eight outputs of each of the command and status registers of command and status register set 160 are connected to a respective one of the six-by-eight lines of bus 154.

In addition, buffer 100 employs a combination of: a set (preferably two) of end-address registers (END ADD #1-2), which are collectively designated 162; a set (preferably two) of comparators (COMPARATOR), which are collectively designated 164; and a set (preferably two) of next-address registers (NEXT ADD #1-2), which are collectively designated 166. The combination is configured to permit the sequential-access and random-access dual-port memory buffer 100 to jump from one dual-port random-access-memory (RAM) cell-array 110 sequential address, stored in the end-address register set (END ADD #1-2) 162, to another dual-port random-access-memory (RAM) cell-array 110 sequential address, stored in the next-address register set (NEXT ADD #1-2) 166.

Each of the end-address registers of set 162 are of sufficient length (thirteen-bits) to store an address of sufficient length to fully address dual-port random access memory (RAM) cell array 110. In the presently preferred embodiment, each of the end-address registers of set 162 are of sixteen-bit length, for purposes of expansion. End-address register set 162 is configured to store in the register addressed responsive to the state of the addressing signals externally generated on the five lowest-order lines of the thirteen lines of parallel-access address bus 104 (A0, A1, A2, A3, and A4) the (sixteen-bit) address represented by the (data-word) signals externally generated on the sixteen lines of, bidirectional, parallel-access data input/output bus 102, when an active (low) level (/CMD) signal is externally generated on command line 150. In addition, end-address register set 162 is configured to develop on the lines on bus 156 signals representing the (two) (sixteen-bit) addresses stored in the registers. For this purpose, end-address-register set 162 is configured with the sixteen inputs of each of the registers connected to a respective one of the two-by-sixteen lines of bus 146 and with the sixteen outputs of each of the registers connected to a respective one of the two-by-sixteen lines of bus 156.

Again, each of the comparators of set 164 are of sufficient length (thirteen-bits) to operate upon an address of sufficient length to fully address dual-port random access memory (RAM) cell array 110. In the presently preferred embodiment, each of the comparators of set 164 are of sixteen-bit length, for purposes of expansion. Each of the comparators of comparator set 164 is associated with a respective one of the registers of end-address-register set 162. Each of the comparators of comparator set 164 is configured to compare the address stored in the associated register of end-address-register set 162 with the address represented by the signals developed on the sixteen lines of internal sequential-access address bus 108 and to develop on a respective line of a (two line) bus 168 a signal, the states of which indicates when an address match occurs. For this purpose, each of the comparators of comparator set 164 is configured with a (first) set of sixteen comparator inputs each connected to the respective one of the sixteen outputs of the corresponding register of end-address-register set 162. In addition, each of the comparators of comparator set 164 is configured with the other (second) set of sixteen comparator inputs each connected to the respective one of the sixteen lines of bus 108 and with the comparator output connected to the respective line (of the two lines) of bus 168.

Similarly, each of the next-address registers of set 166 are of sufficient length (thirteen-bits) to store an address of sufficient length to fully address dual-port random access memory (RAM) cell array 110. In the presently preferred embodiment, each of the next-address registers of set 166 are of sixteen-bit length, for purposes of expansion. Next-address-register set 166 is configured to store in the register addressed responsive to the state of the addressing signals externally generated on the five lowest-order lines of the thirteen lines of parallel-access address bus 104 (A0, A1, A2, A3, and A4) the (sixteen-bit) address represented by the (data-word) signals externally generated on the sixteen lines of, bidirectional, parallel-access data input/output bus 102, when an active (low) level (/CMD) signal is externally generated on command line 150. In addition, next-address-register set 166 is configured to develop on the lines of bus 158 signals representing the (two) (sixteen-bit) addresses stored in the next-address registers. For this purpose, next-address-register set 166 is configured with the sixteen inputs of each of the registers connected to a respective one of the two-by-sixteen lines of bus 148 and with the sixteen outputs of each of the registers connected to a respective one of the two-by-sixteen lines of bus 158.

Buffer 100, also, employs a combination of an incrementor 180 and a pointer register 182. The combination is configured to provide dual-port random-access-memory (RAM) cell array 110 a sequential address. Incrementor 180 is of sufficient length (thirteen-bits) to operate upon an address of sufficient length to fully address dual-port random-access-memory (RAM) cell array 110. In the presently preferred embodiment, incrementor 180 is of sixteen-bit length, for purposes of expansion. Incrementor 180 is configured with the set of sixteen incrementor inputs each connected to the respective one of the sixteen lines of internal address bus 108 and with the set of sixteen incrementor outputs each connected to the respective line of a sixteen-line bus 184. Responsive to the address represented by the sixteen signals developed on bus 108, incrementor 180 is operative to develop on bus 184 signals representing the address, incremented (address plus one).

Pointer register 182 is of sufficient length (thirteen-bits) to store an address of sufficient length to fully address dual-port random access memory (RAM) cell array 110. In the presently preferred embodiment, pointer register 182 is of sixteen-bit length, for purposes of expansion. Pointer register 182 is configured with the set of sixteen register data inputs each connected to the respective line of a sixteen-line bus 186; with the register clock (load) input connected to a line 188, to receive a sequential-clock (SCLK) signal externally-generated thereon; and with the set of sixteen register data outputs each connected to the respective one of the sixteen lines of internal address bus 108. Pointer register 182 is responsive to the clock (SCLK) signal, externally generated on line 188, and operative to latch (store) the state of the signals developed on the sixteen lines of bus 186 (whether in a read or write cycle) and to develop on the sixteen lines of bus 108 signals having the latched (stored) states.

In another embodiment, incrementor 180 and pointer register 182 are replaced by a counter configured with the set of sixteen counter pre-set (load) inputs each connected to the respective line of the sixteen lines of bus 186; with the counter clock (increment) input connected to line 188; and with the set of sixteen counter outputs each connected to the respective one of the sixteen lines of internal address bus 108.

Buffer 100, further, employs a pointer-multiplexer set 190. In the presently preferred embodiment, pointer-multiplexer set 190 includes a set of sixteen, four-line-to-one-line multiplexers configured to develop a set of (sixteen) signals on bus 186 so as to couple (sixteen-bit) addresses from a selected one of four busses to bus 186. For this purpose, each of the multiplexers of set 190 is configured with (a first) one of the multiplexer data inputs connected to the respective line of the sixteen lines of bus 158; with another (second) one of the multiplexer data inputs connected to the respective line of the sixteen lines of bus 136; with yet another (third) one of the multiplexer data inputs connected to the respective line of the sixteen lines of bus 184; with the remaining (fourth) one of the multiplexer data inputs connected to the respective line of the sixteen lines of internal address bus 108; and with the multiplexer data output connected to the respective line of the sixteen lines of bus 186. Finally, the multiplexers of set 190 are configured each with the set of five multiplexer select inputs connected to the respective line of a five line bus 192. In another embodiment, the multiplexers of set 190 are not connected to the lines of bus 108.

Finally, buffer 100 employs a pointer-logic unit 200 and a "semaphore circuit for sequential-access and random-access dual-port memory buffer" 202. Pointer-logic unit 200 includes a set (of two) unit inputs, each connected to the respective line (of the two lines) of bus 168; a set of five unit outputs connected to the respective line of the five lines of bus 192; and a number of unit inputs connected as follows. Pointer-logic unit 200 includes an input connected to a line 210 to receive an externally-generated (active-low) sequential-chip-enable (/SCE) signal. Responsive to an active (high) signal level externally generated thereon, pointer-logic unit 200 turns on, bidirectional, serial-access data input/output bus 106; powers up dual-port random-access-memory (RAM) cell array 110; and allows sequencing (incrementing of pointer register 182) to occur. Further, pointer-logic unit 200 includes an input connected to a line 212 to receive an externally-generated (active-low) sequential-buffer-transfer (/SBT) signal and an input connected to a line 214 to receive an externally-generated sequential-buffer-select (/SSEL) signal. Responsive to an active (low) signal level externally-generated on sequential-buffer-transfer (/SBT) signal line 212, pointer-logic unit 200 loads the address stored in a selected one of the end-address registers (END ADD #1-2) 162 into pointer register 182 at the time designated by the sequential, clock (SCLK) signal externally-generated on line 188. The sequential-buffer-select (/SSEL) signal externally-generated on line 214 designates (selects) the register of end-address register set (END ADD #1-2) 162 from which the address is taken. In addition, pointer-logic unit 200 includes an input connected to a line 216 to receive an externally-generated (active-low) sequential-load (/SLD) signal. Responsive to an active (low) signal level externally generated on sequential-load (/SLD) signal line 216, pointer logic unit 200 loads (as a start sequence address) the address represented by (the data-word) signals externally-generated on, bidirectional, data input/output bus 106 into pointer register 182 at the time designated by the sequential, clock (SCLK) signal externally generated on line 188.

In one embodiment, "semaphore circuit for sequential-access and random-access dual-port memory buffer" 202 is of the type which is disclosed in the U.S. Pat. No. 4,780,822 of Michael J. Miller issued Oct. 25, 1988.

It is contemplated that after having read the preceding disclosure, certain alterations and modifications of the present invention will no doubt become apparent to those skilled in the art. It is therefore intended that the following claims be interpreted to cover all such alterations and modifications as fall within the true spirit and scope of the invention.

What is claimed is:

1. A memory buffer (100) for asynchronously operating between random-access and sequential-access ports, comprising:

a dual-port memory array (110) having a first port comprising a parallel address input and parallel data input/output and a second port comprising a sequential address input and a sequential data input/output;

a random-access port (102 and 104) coupled to said first port of the dual-port memory array (110) for providing data to and from the dual-port memory on a data input/output bus (102) in response to an externally-provided address input (104);

a sequential-access port (106) coupled to said second port of the memory array (110) for providing data to and from the dual-port memory sequentially in blocks of data in response to an externally-provided clock input (188);

a pointer register (182) connected to said sequential address input of said second port of the dual-port memory array (110) for an orderly addressing of a plurality of discontinuous data blocks within the dual-port memory array (110) and for providing sequential data access of the dual-port memory array (110) to the sequential-access port (106) with an address output (108) that points to a memory address to be accessed;

an incrementor (180) connected as an input to a pointer multiplexer (190) and for providing an incrementing of said address output (108) to said sequential address input of the dual-port memory array (110) wherein said address output (108) represents an address within any one of said plurality of discontinuous data blocks;

a plurality of end-address registers (162) and corresponding comparators (164) connected to an output of the pointer register (182) for providing detection of when said address output (108) to the dual-port memory array (110) by the pointer register (182) matches an address loaded into anyone of the plurality of end-address registers (162) and that represents an ending address of any one of said plurality of discontinuous data blocks;

a plurality of next-address registers (166) connected as additional inputs to said pointer multiplexer (190) and the pointer register (182) and for providing an address from a selected one of the plurality of next-address registers (166) that represents a starting address of a next one of said plurality of discontinuous data blocks to be addressed to the pointer register (182) in support of any sequential data block access by the sequential-access port (106), wherein said selected one of the plurality of next-address registers (166) is selected by said pointer multiplexer (190) in response to an output of the plurality of end-address registers (162) and corresponding comparators (164) to a pointer logic (200) that controls said pointer multiplexer (190); and register loading means (140, 144, 146, and 148) connected to a plurality of command/status registers (160) for controlling a data output multiplexer (142) between the dual-port memory array (110) and the random-access port (102), for loading addresses in the plurality of end-address registers (162), for loading addresses in the plurality of next-address registers (166), and for providing an individual initialization of each said command/status, end-address and next-address register (160, 162 and 166) with data respectively representing commands, status, ending addresses and next addressing control.

2. The buffer of claim 1 wherein:

the random-access port is connected to appear externally as a random-access-memory RAM cell array for a microprocessor-type device interface with said data bus (102) and said parallel-address bus input (104); and the sequential-access port is connected for direct memory access (DMA) type access.

3. The buffer of claim 1, wherein:

the random-access port includes interface means for sixteen parallel bits of data and thirteen parallel bits of address with said data input/output bus (102) and said parallel-address bus input (104); and the sequential-access port includes interface means for sixteen bits of data sequentially communicated in and out of said buffer with a shared, multiplexed bus for address input.

* * * * *